United States Patent [19]
Heater et al.

[11] Patent Number: 6,141,866
[45] Date of Patent: Nov. 7, 2000

[54] UNIVERSAL TOOL FOR UNIFORMLY APPLYING A FORCE TO A PLURALITY OF COMPONENTS ON A CIRCUIT BOARD

[75] Inventors: James Westcott Heater, Harrisburg; Allen Thomas Mays; John Gillette Davis, both of Charlotte, all of N.C.

[73] Assignee: International Business Machines Corporation, Armonk, N.Y.

[21] Appl. No.: 09/030,447

[22] Filed: Feb. 25, 1998

[51] Int. Cl.[7] .................................................. B23P 19/04
[52] U.S. Cl. ................................ 29/740; 29/832; 29/739; 29/743; 29/713; 414/404; 414/416; 269/903
[58] Field of Search ........................... 29/740, 741, 840, 29/832, 739, 742, 743, 844, 565, 713; 228/180.21, 180.22, 6.2, 264, 48, 49.1; 414/404, 416, 811; 269/903, 73; 198/377.07, 377.08

[56] References Cited

U.S. PATENT DOCUMENTS

| | | | |
|---|---|---|---|
| 3,574,935 | 4/1971 | Berg | 29/844 |
| 4,295,596 | 10/1981 | Doten et al. | 228/180 |
| 4,899,920 | 2/1990 | Abbagnaro et al. | 228/11 |
| 4,944,086 | 7/1990 | Nishihara et al. | 29/741 |
| 4,948,026 | 8/1990 | Fritsch | 228/6.2 |
| 5,040,291 | 8/1991 | Janiewicz et al. | 29/840 |
| 5,086,559 | 2/1992 | Akatsuchi | 29/834 |
| 5,093,984 | 3/1992 | Lape | 29/741 |
| 5,290,134 | 3/1994 | Baba | 414/404 |
| 5,346,011 | 9/1994 | Baker et al. | 228/180.21 |
| 5,439,161 | 8/1995 | Kawatani et al. | 228/180.1 |
| 5,758,558 | 6/1998 | Squires | 83/522.18 |
| 6,019,564 | 1/2000 | Kiyakawa et al. | 414/416 |

*Primary Examiner*—Lee Young
*Assistant Examiner*—A. Dexter Tugbung
*Attorney, Agent, or Firm*—Pollock Vande Sande & Amernick, RLLP

[57] ABSTRACT

A multiple force tool for applying pressure to circuit components during a manufacturing operation. A plurality of compressed air pressure cylinders are supported on a plurality of horizontal arms over a circuit board. A pressure foot of each compressed air pressure cylinder is extendable when an air controller foot switch is depressed. Positioning of each of the cylinders is afforded along two axes, so that the cylinders may be positioned over components which are to be pressed against the circuit board. Heat sinks may be pressed against components located on the circuit board to bond the heat sinks to the components.

8 Claims, 5 Drawing Sheets

UNIVERSAL TOOL FOR UNIFORMLY APPLYING A FORCE TO A PLURALITY OF COMPONENTS ON A CIRCUIT BOARD

FIELD OF THE INVENTION

The present invention relates to an apparatus and process for manufacturing electronic circuit boards. Specifically, a tool for applying a force to a component being bonded to a circuit board is described.

BACKGROUND OF THE INVENTION

Electronic circuit boards are manufactured by mounting components on a printed circuit board. The printed circuit board includes printed circuit wiring which connects terminals of the components in an electrical circuit. The electrical components on the board often include a heat sink to maintain the electrical component temperature at a safe level. The heat sinks are typically applied to circuit board components with an adhesive which has good heat transfer characteristics. During the process of bonding the heat sink to a component, the adhesive material is applied to the component or heat sink, and a uniform amount of pressure is applied to the heat sink to establish a high strength bond with the component. The integrity of the bond is maintained by utilizing a uniform amount of pressure on each heat sink being adhered to the components.

As more than one component might require a heat sink, the heat sinks are individually applied to each component. A fixture holds the component within a press which applies a force to the heat sink, and must necessarily be configured for each individual component as they occupy different positions on the circuit board. To apply heat sinks to different components therefore requires reestablishment of the press position versus the component/heat sink position. Additionally, the heat sink sizes change from component to component, and the amount of pressure applied to different heat sinks, which may be bonded with different adhesives, changes from component to component. These problems have been addressed in the past by employing custom or unique tooling devices to accommodate each heat sink size, as well as circuit board component location on a circuit board, creating inefficiencies in the manufacture of electronic circuit boards.

SUMMARY OF THE INVENTION

It is an object of this invention to provide a press for simultaneously applying a force to multiple components and heat sinks on a circuit board.

This and other objects of the invention are provided for by a press which is capable of simultaneously applying force to multiple components of a circuit board assembly. Multiple support channels are provided along a surface of a pressing tool, which support a number of arms which extend over a circuit board. A pressure cylinder is supported on each of the horizontally extending arms and positioned over a respective component which is to receive an applied force. The horizontally extended arms may be positioned along one axis within a respective support channel, while the plurality of pressure cylinders may be positioned along a second axis coincident with the horizontally extending arm supporting the cylinder. Thus, the cylinders may be positioned into alignment with a single component on a circuit board, and, when activated, simultaneously apply the required force to a component on the circuit board.

In a preferred embodiment of the invention, the pressure cylinders are operated by compressed air supplied by a regulated source of compressed air. A foot valve is connected to the source of compressed air which when operated simultaneously applies an actuating pressure to each of the compressed air cylinders, which results in an extension of the piston within the cylinders to apply a force to each component located under the cylinders. The amount of pressure as well as the duration of the pressure applied to a component may be accurately controlled ensuring uniformity from circuit board to circuit board.

DESCRIPTION OF THE PREFERRED EMBODIMENT

Figure 1:
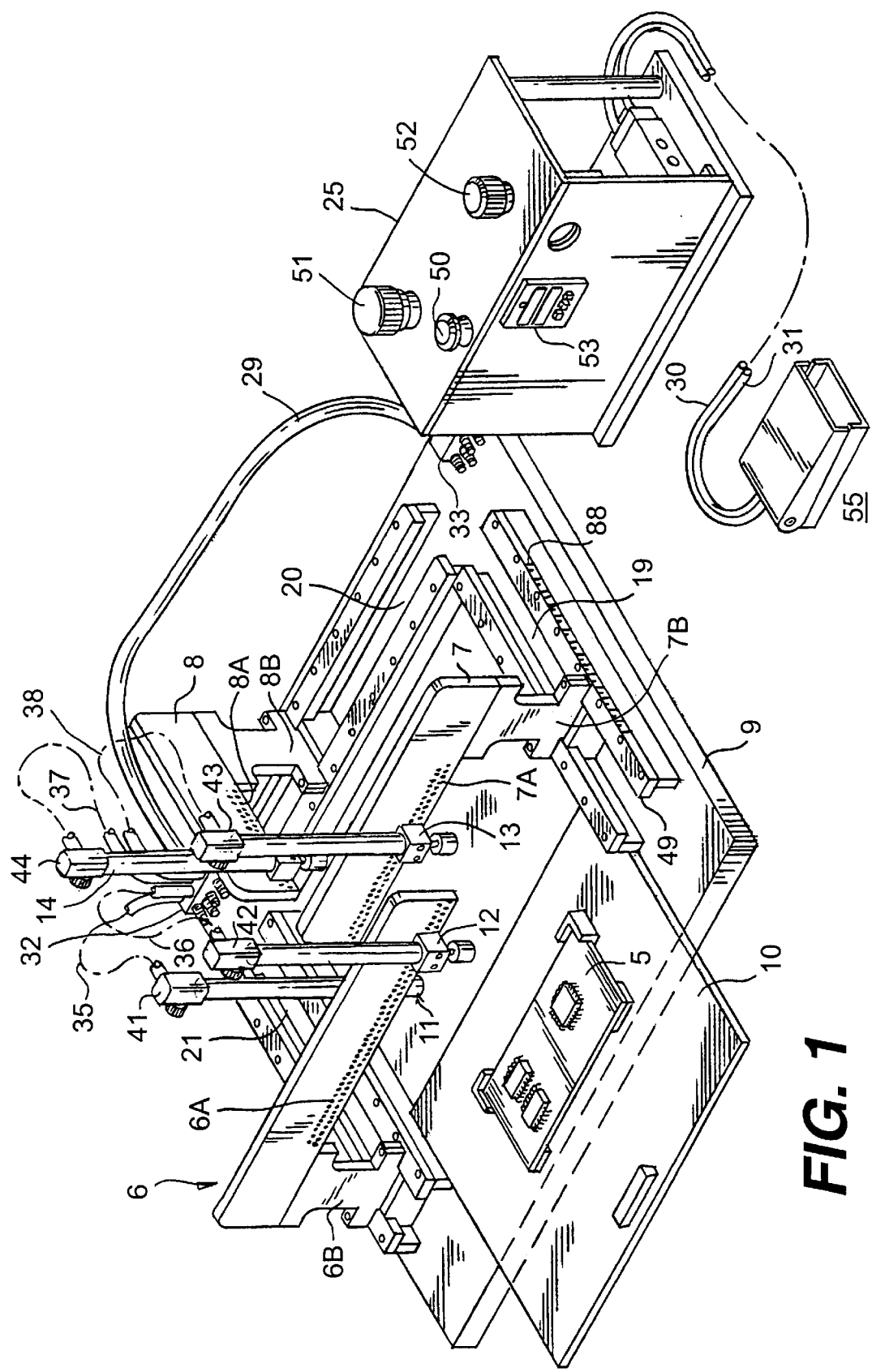
FIG. 1 is an overall isometric view of the multiple force tool in accordance with a preferred embodiment.

Referring now to FIG. 1, there is shown an isometric view of a multiple force tool for applying a bonding force to multiple components (three of which are shown) on a circuit board 5 supported on a positioning slide 10. When slide 10 is guided into place against the rails of channels 19, 20 and 21, each of the three components shown on circuit board 5 may be appropriately aligned with the ends of a plurality of air cylinders 11, 12, 13 and 14. Cylinders 11 through 14 may be positioned along two axes. The first axis is coincident with the major axes of support arms 6 through 8, and a series of holes 6A, 7A, and 8A along the surface of each of arms 6 through 8 provide various locations in which to mount the respective air cylinder 11–14.

Each of the arms, 6, 7 and 8 is supported within a channel 19 through 21. The horizontally extending arms 6 through 8 are connected to the channel by supports 6B, 7B and 8B. The supports are positionable within the channel to position a respectively supported air cylinder 11–14 along a second axis.

Each of the arms 6 through 8 may have different lengths. The holes 6A, 7A and 8A may also be made of one or more slots, to permit positioning a respective air cylinder along the length of an arm 6, 7 and 8.

The air cylinders 11–14 are operated from a air controller 25 which is connected to a source of compressed air. Compressed air is provided to manifolds 32, 33 provided by hoses 28, 29, which in turn supply compressed air to hoses 35–38 for operating each of the air cylinders 11–14. The manifolds 32, 33 receive air pressure from the air controller 25 and distribute the pressure to each individual air cylinder via hoses 35–38.

In this example, two manifolds are provided to accommodate a larger number of air cylinders.

Each of the air cylinders 11–14 includes a flow control valve 41 through 44. In operation, the flow of compressed air is controlled by a foot switch 55 connected by hoses 30, 31 to the air controller 25 to generate a timed pulse of air for operating each of the air cylinders 11–14. A timer 53 of the air controller 25 establishes the length of an air pulse to be applied to each of the air cylinders 11–14 which in turn establishes the length of time the piston of each air cylinder is extended against a component on circuit board 5 during a pressing operation.

The pressure level of the air pulse is established by a control 52 of a regulator. An emergency shut off 50, shuts down the air supply to all the cylinders when operated. The regulator control 51 regulates the air pressure applied to the air controller 25.

Figure 2:
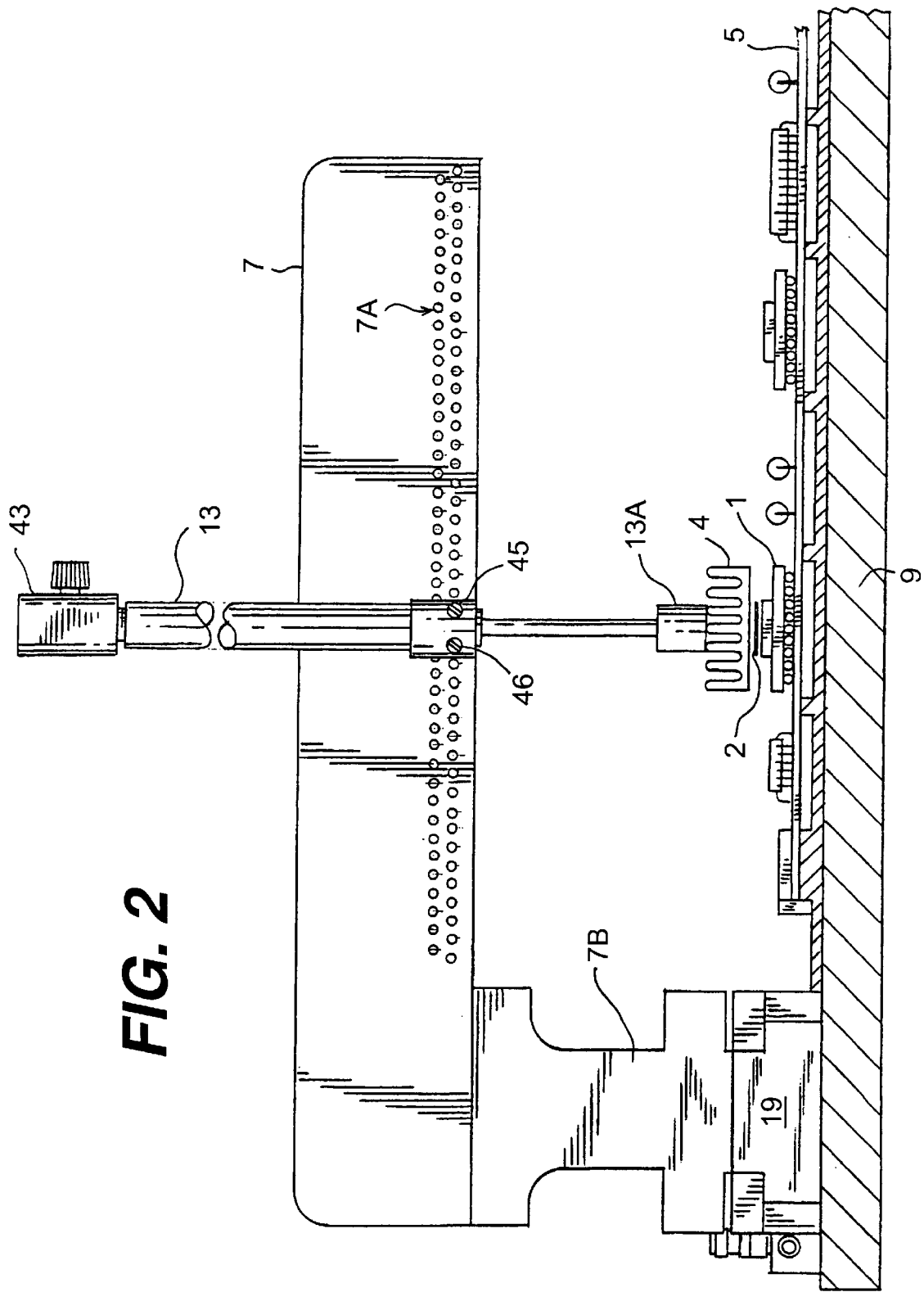
FIG. 2 illustrates a side view of one of the force-applying air pressure cylinders of the device of FIG. 1.

FIG. 2 illustrates the operation of the device with respect to one of the air cylinders 13. The air cylinder 13 in FIG. 2 has a piston with a pressure foot 13A which is extended as a result of air pressure supplied through the flow control valve 43. The pressure foot 13A forces a heat sink into pressure contact with a circuit board component mounted on circuit board 5. An adhesive 2 is shown which will bond the heat sink 4 to the circuit board component once the heat sink 4 is forced into contact with the circuit board component 1.

The quality of the resulting bond is controlled in part by the magnitude of the force applied by pressure foot 13A, as well as the duration of the force. As was noted with respect to FIG. 1, the value of the applied pressure is controlled by the air controller 25, along with the duration of the applied force. The position of the air cylinder 13 along one axis is established by mounting holes 7A of the horizontally extending arm 7. A pair of screws 45 and 46 hold the air cylinder 13 to the arm 7 so that the pressure foot 13A is positioned along the axis defined by arm 7 aligned with the appropriate component 1.

Figure 3:
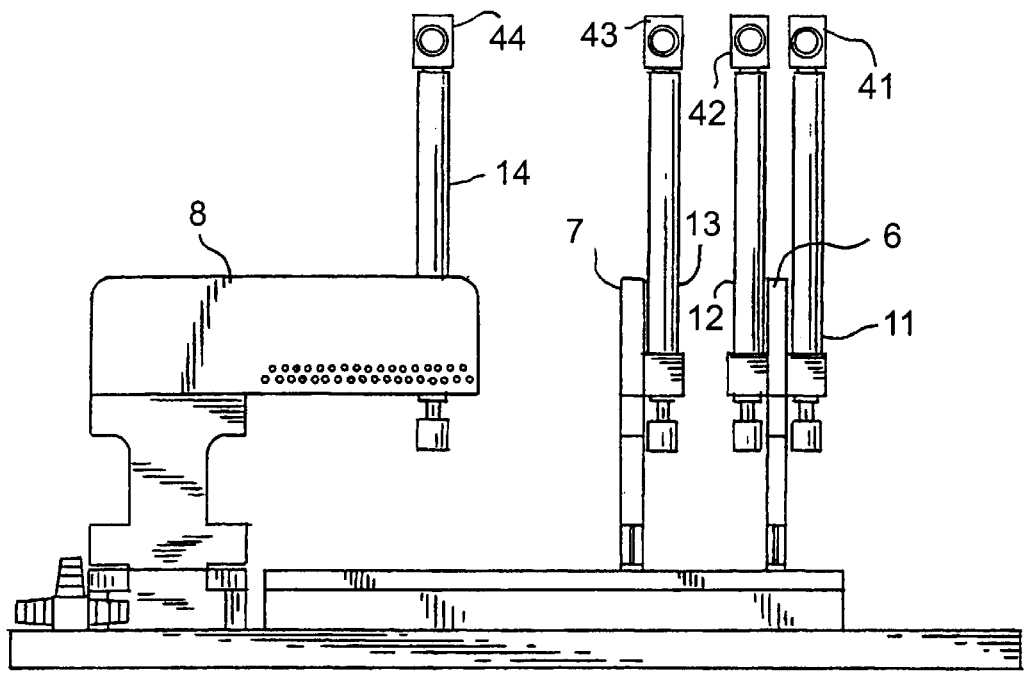
FIG. 3 illustrates a second view of the device of FIG. 1 which illustrates the positioning of a plurality of pressure cylinders with respect to a circuit board.
Figure 4:
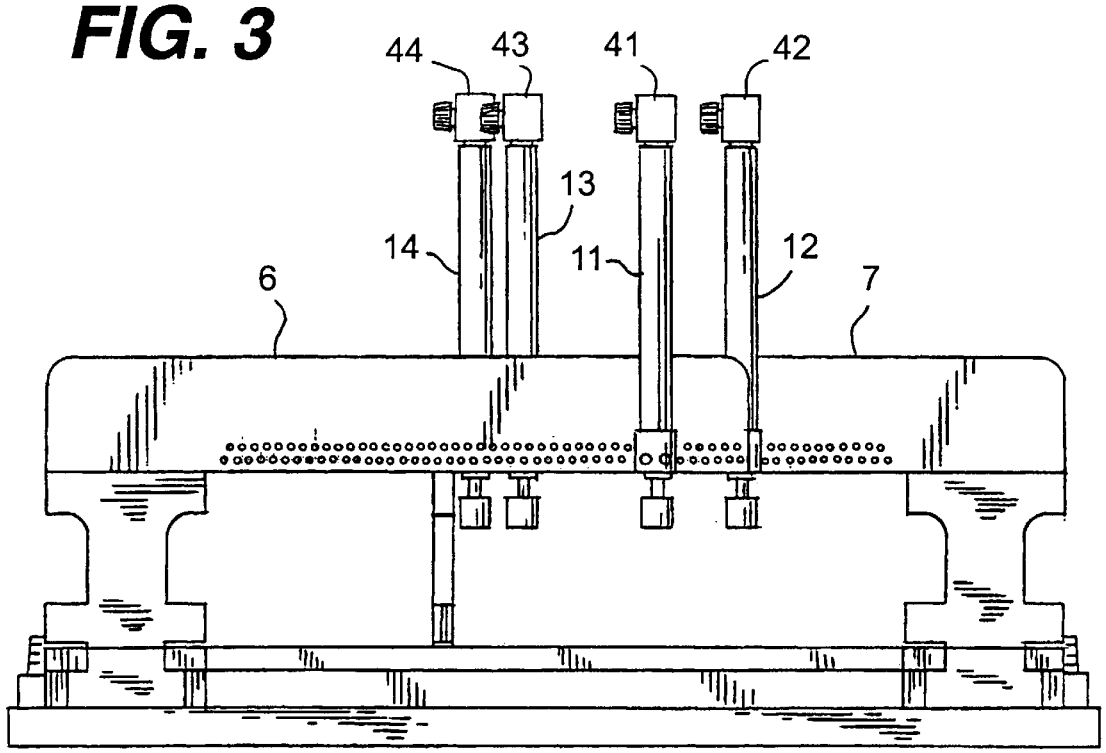
FIG. 4 is another side view of the device of FIG. 1.
Figure 5:
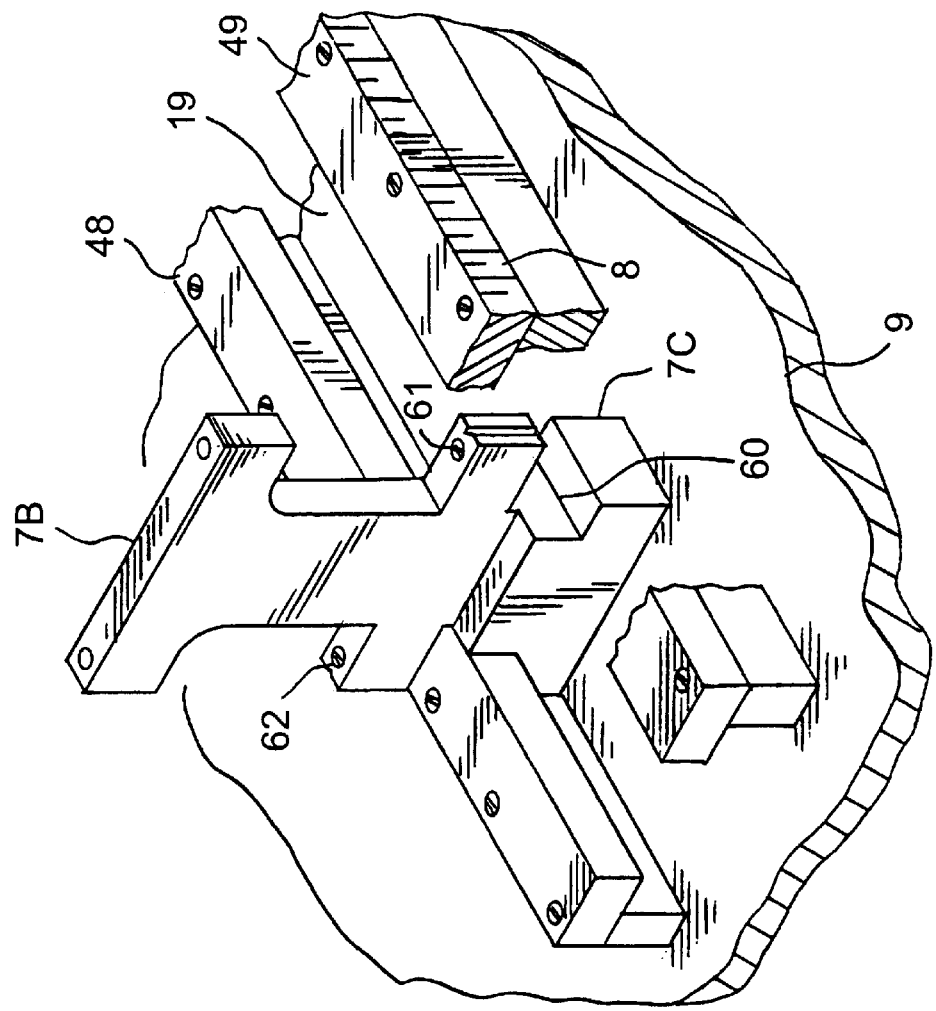
FIG. 5 illustrates the structure for supporting each horizontal arm in a channel of the tool.
Figure 6:
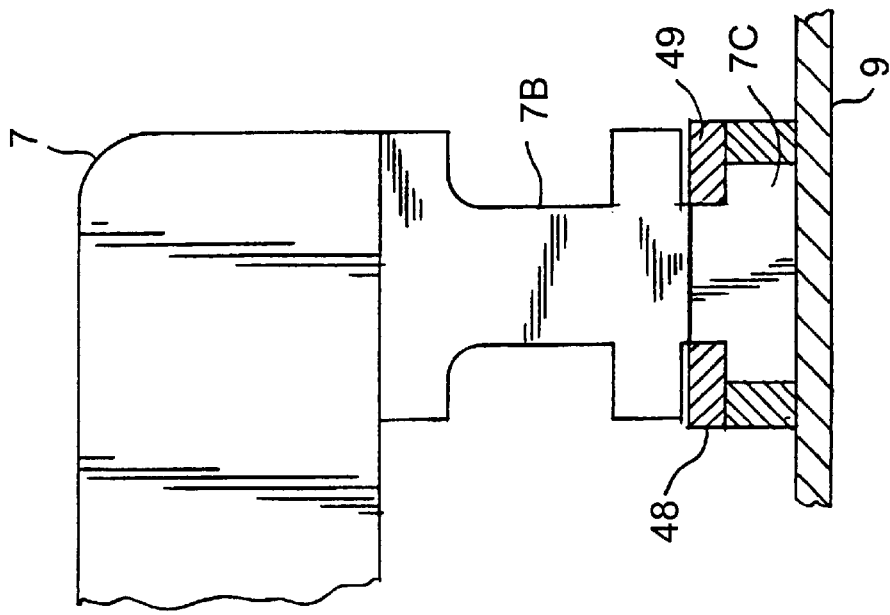
FIG. 6 is a side section view of FIG. 5.

FIGS. 3 and 4 illustrate two views of the multiforce device which demonstrate the versatility of the device for circuit boards having different component layouts. As shown in FIG. 3, a pair of air cylinders 11 and 12 may be included on the same horizontal arm 6. Horizontal arm 6 and horizontal arm 7 may be positioned along an axis perpendicular to the direction of movement of horizontal arm 8 to align the air cylinders 41–43 with respect to components on circuit board 5. The positioning of arms 6 and 7 is provided for by the channel structure illustrated in FIGS. 5 and 6. The channel 19 is bounded by two rails 48 and 49. Rails 48 and 49 captivate a lower portion 7C of vertical support 7B. Lower portion 7C includes a slot 60 which maintains the vertical support 7B within the channel 19. A pair of set screws 61 and 62 provide for fixing the vertical support 7B to the rails 48 and 49 when the position of the arm 7 has been established.

Figure 7:
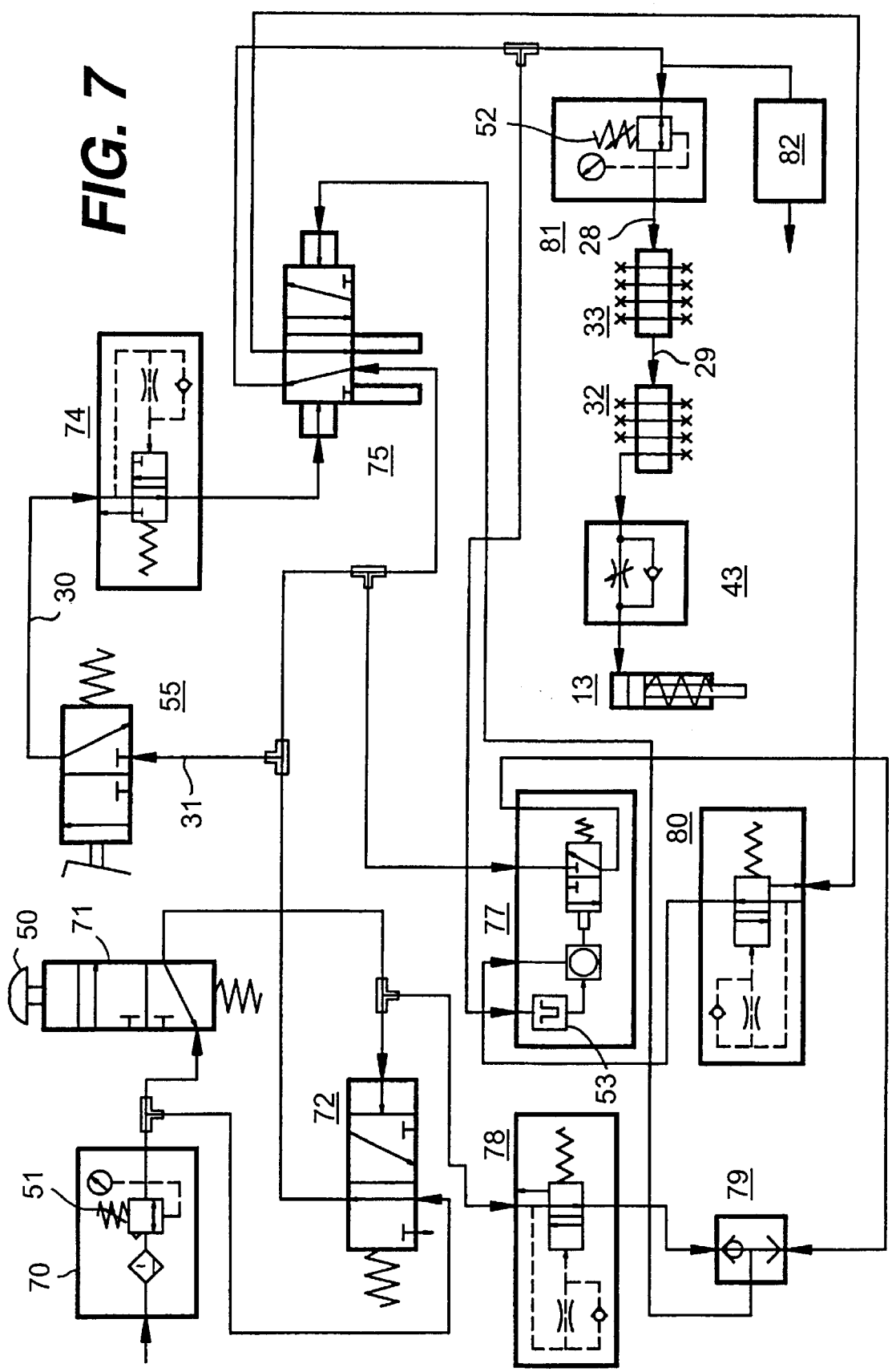
FIG. 7 is a pneumatic diagram of a pneumatic air controller for operating each of the air cylinders.

The air controller 25 is connected to a compressor (not shown) and derives from the compressor air flow for the required air pulse for operating each of the air cylinders 11–14. A detailed schematic of the air controller 25 is illustrated in FIG. 7. Referring to FIG. 7, air from the compressor is supplied to a filter/regulator 70 within the air controller 25 which filters and regulates the air pressure from the compressor. An emergency power-off valve 71 is actuated by an actuator 50 to turn off the air supply in an emergency. This would result in each pressure foot of each air cylinder 11–14 being retracted by a spring internal to each air cylinder. A single pilot valve 72 supplies the air pressure in the absence of the operation of the emergency valve to the remaining components of the air controller.

The operation of the air controller for pressurizing each of the air cylinders 11–14 begins when the foot valve 55 is operated. The air pressure produced from operation of the foot valve 55, is converted into a short pulse of air by a one shot valve 74. A double pilot valve 75 operated from the pulse of air produced by one shot valve 74, to supply air to regulator 81. The cylinders 11–14 are retracted, when a pulse of air is sent from OR gate 79 to the double pilot valve. The cycle of operating the air cylinders to extend and retract the pressure feet is controlled by a pneumatic timer 77. The pneumatic timer 77 is preset to generate a time interval following activation of the double pilot valve 75.

The air pulse supplied to regulator 81 is also applied to the input of a timer 77 to begin timing. Once the set time established by control 55 of the timer 77 has elapsed, a reset signal is sent from the timer to OR gate 79, which, as noted above, resets the double pilot valve 75. The single shot valve 78, in an emergency condition also provides a reset air pulse via OR gate 79 to the double pilot valve 75 for resetting the valve 75. The timer 77 is reset by one shot valve 80, following the reset of the double pilot valve 75.

The air controller 25 provides the pulsed air via regulator 81 to each of two manifolds 32 and 33. The outputs from the manifolds 32 and 33 supply air pressure to the flow control valves 41–44 and air cylinders 11–14. A second air regulator 82 may be provided for operating other air cylinders where different air pressures are required.

The flow control valves 41–44 regulate the speed of the air cylinder during extension of the pressure feet of the air cylinders. As such, it avoids any excessive dynamic forces on the component being pressed.

The air controller 25 provides a uniform application of pressure among each of the air cylinders, so that heat sinks, or other components could be bonded to the circuit board in one single operation. Multiple air cylinders avoid having to realign the circuit board in order to apply force to multiple locations on the circuit board, thus saving manufacturing time and assuring a uniform force application.

Positioning of the arms 6, 7 and 8 along each of the channels 19, 20 and 21 may be facilitated by affixing a ruler 88 having position indicia to the sides of the rails of each of the channels. Thus, the vertical supports 6B, 7B and 8B may be accurately positioned for a given component layout on each circuit board 5.

The foregoing description of the invention illustrates and describes one embodiment of the present invention. Additionally, the disclosure shows and describes only the preferred embodiment of the invention, but as aforementioned, it is to be understood that the invention is capable of use in various other combinations, modifications, and environments and is capable of changes or modifications within the scope of the inventive concept as expressed herein, commensurate with the above teachings, and/or the skill or knowledge of the relevant art. The embodiment described hereinabove is further intended to explain best mode known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

What is claimed is:

1. A multiple force tool for establishing a pressure on circuit board components during manufacture of a circuit board bearing said components comprising:

first, second, and third channels supporting a plurality of horizontal arms, said channels being located about the periphery of a surface which is adapted to support said circuit board so that said horizontal arms extend over said circuit board;

a plurality of compressed air pressure cylinders supported on said horizontal arms, having a pressure foot which is extendable in response to compressed air and is adapted to apply a force on a component of said circuit board located beneath said pressure foot; and a source of compressed air connected to said compressed air pressure cylinders, operable in response to a foot valve for extending said pressure feet against said circuit components including a timer means which operates in response to a closure of said foot valve to produce a timed pulse of compressed air to said compressed air cylinders whereby said pressure feet are extended for a period of time controlled by said timer.

2. The multiple force tool according to claim 1 wherein said source of compressed air supplies said timed pulse of compressed air having a preset duration and magnitude.

3. The multiple force tool according to claim 1 wherein said compressed air is supplied through a flow control valve to said compressed air pressure cylinders for regulating the speed of extension of said pressure foot.

4. The multiple force tool according to claim 2 further comprising a pressure regulator connected to said timer means for receiving said pulse of compressed air and connected to a manifold which supplies said pulse of compressed air to said compressed air cylinders.

5. The multiple force tool according to claim 4 further comprising a flow control valve connected between each of said compressed air cylinders and said manifold.

6. The multiple force tool according to claim 5 wherein said horizontally extending arms are positionable along said channels to vary the location of said pressure cylinders along a first axis.

7. The multiple force tool according to claim 5 wherein said horizontally extending arms include means for positioning said pressure transducers along a second axis.

8. The multiple force tool according to claim 7 wherein said channels include position indicia for establishing a position coordinate for said pressure cylinders along said first axis.

* * * * *